(12) United States Patent
Takeda et al.

(10) Patent No.: US 7,973,877 B2
(45) Date of Patent: Jul. 5, 2011

(54) ILLUMINATION DEVICE AND LIQUID CRYSTAL DISPLAY APPARATUS

(75) Inventors: Daisuke Takeda, Nara (JP); Tomotoshi Sato, Nara (JP); Akira Ohnishi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 363 days.

(21) Appl. No.: 12/087,766

(22) PCT Filed: Jan. 12, 2007

(86) PCT No.: PCT/JP2007/050352
§ 371 (c)(1),
(2), (4) Date: Oct. 30, 2008

(87) PCT Pub. No.: WO2007/080984
PCT Pub. Date: Jul. 19, 2007

(65) Prior Publication Data
US 2009/0219460 A1 Sep. 3, 2009

(30) Foreign Application Priority Data
Jan. 13, 2006 (JP) .................... P2006-006543

(51) Int. Cl.
G02F 1/1335 (2006.01)
H05B 37/00 (2006.01)
F21V 7/04 (2006.01)
F21V 11/00 (2006.01)
B64F 13/18 (2006.01)

(52) U.S. Cl. .......... 349/61; 315/193; 362/612; 362/559; 362/508

(58) Field of Classification Search .................... 349/61; 315/193; 362/612, 559, 508
See application file for complete search history.

(56) References Cited

U.S. PATENT DOCUMENTS

| 6,577,072 B2 * | 6/2003 | Saito et al. ............... 315/185 R |
| 2009/0237004 A1 * | 9/2009 | Ploquin et al. ............... 315/294 |
| 2010/0194274 A1 * | 8/2010 | Hoogzaad ..................... 315/51 |

FOREIGN PATENT DOCUMENTS

| JP | 2000-89224 | 3/2000 |
| JP | 2002-25784 | 1/2002 |
| JP | 2002025784 A * | 1/2002 |
| JP | 2002-244626 | 8/2002 |
| JP | 2003-162229 | 6/2003 |
| JP | 2005-49631 | 2/2005 |
| WO | WO-01/45470 | 6/2001 |

* cited by examiner

*Primary Examiner* — Mike Qi
(74) *Attorney, Agent, or Firm* — Edwards Angell Palmer & Dodge LLP; David G. Conlin; George N. Chaclas

(57) ABSTRACT

An object of the invention is to provide an illumination device that can make it easy to detect a disorder of a light emitting element, and a liquid crystal display apparatus including the illumination device. Each light emitting element array (S) is constituted by light emitting elements (T) which are connected in series. To the light emitting elements (T) are individually connected in parallel current bypass elements (U) that are changed from a disconnected state where no current flows to a connected state where current flows when a predetermined voltage higher than that applied to the light emitting elements in an lighting state is applied thereto. Each power source unit (P) is connected to each light emitting element array (S) in series, and supplies constant current to each light emitting element (T). Terminal units for voltage detection (11) are connected to an anode (A) of each light emitting element (T).

6 Claims, 9 Drawing Sheets

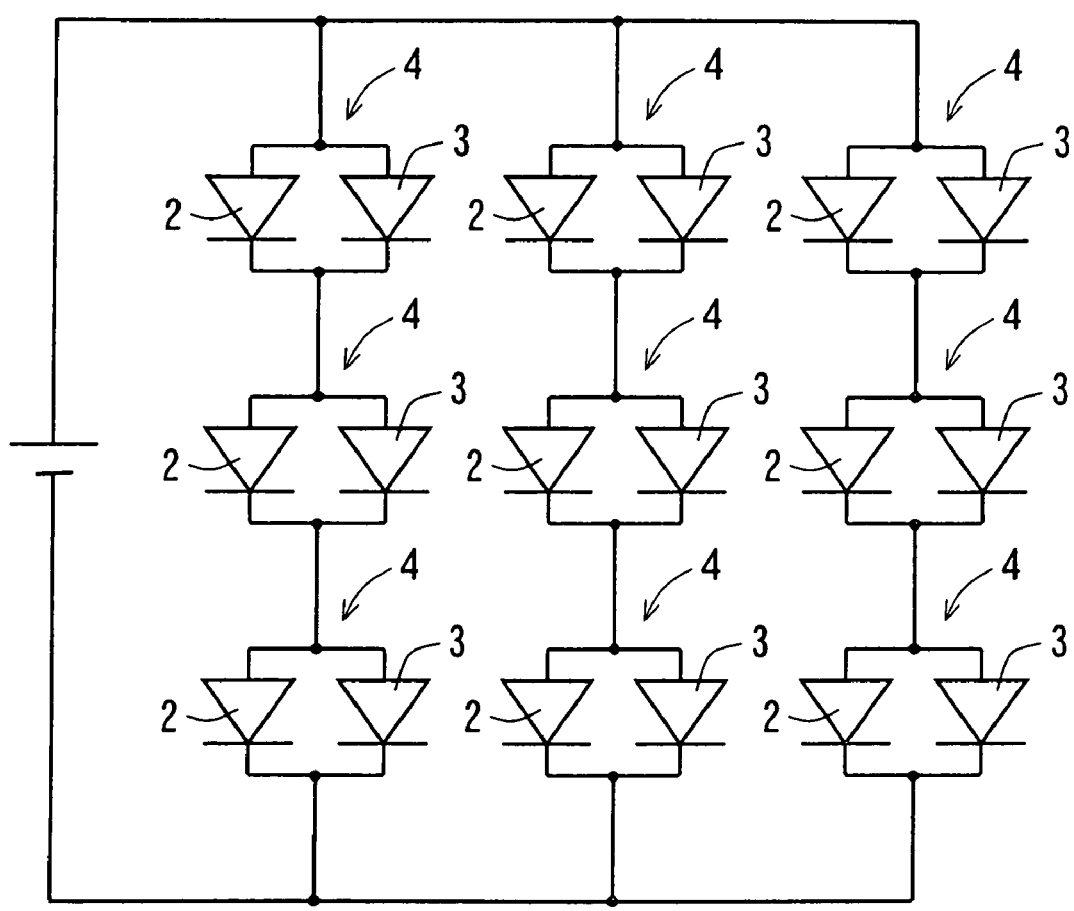
FIG. 11 ILLUMINATION DEVICE 1

ILLUMINATION DEVICE AND LIQUID CRYSTAL DISPLAY APPARATUS

CROSS-REFERENCE TO RELATED APPLICATION

This application is the U.S. national phase, pursuant to 35 U.S.C. §371, of international application No. PCT/JP2007/050352, published in Japanese on Jul. 19, 2007 as international publication No. WO 2007/080984 A 1, which claims the benefit of Japanese application Ser. No. JP 2006-006543, filed Jan. 13, 2006, the disclosure of which applications are incorporated herein in their entireties by this reference.

TECHNICAL FIELD

The present invention relates to an illumination device and a liquid crystal display apparatus having the same.

BACKGROUND ART

Since liquid crystal panels have a low driving voltage and low power consumption and can easily performs multiple gray-scale display, the liquid crystal panels are widely used in large-scaled displays.

The liquid crystal panels visually display image information using external light, because the liquid crystal panels do not emit light voluntarily. The liquid crystal display apparatuses are classified into a reflective type and a transmissive type depending on mechanisms lighting the liquid crystal panels. Since the reflective liquid crystal display apparatuses use external light, the reflective liquid crystal display apparatuses cannot visually display image information in dark places such as outdoors at night and dark indoors. In order to visually display the image information in the dark places, the transmissive liquid crystal display apparatuses include an illumination device called a backlight lighting the liquid crystal panels from a rear side thereof.

A cold cathode fluorescent lamp (abbreviated as CCFL) is widely used in the backlight. The cold cathode fluorescent lamp has a large size, thereby making it difficult to reduce the size of the backlight. In addition, since the cold cathode fluorescent lamp requires a booster circuit and a stabilizer for a driving circuit, there is a problem in that the configuration of the backlight is complicated. In order to solve such a problem, with the practical utilization of a blue light emitting diode (abbreviated as "LED"), there has been suggested an illumination device employing an LED that can be easily reduced in size in comparison with the cold cathode fluorescent lamp and that does not require a booster circuit and a stabilizer for a driving circuit as a backlight.

In the related art, an illumination device including plural LEDs has been known (for example, see Japanese Unexamined Patent Publication JP-A 2003-162229).

In addition, in another related art, an illumination device controlling brightness on the basis of character information, image information, and photograph information displayed on the liquid crystal panel has been known (for example, Japanese Unexamined Patent Publication JP-A 2005-49631).

Since an LED has smaller light intensity than the CCFL, most illumination devices include plural LEDs. Particularly, since an illumination device lighting a large-sized liquid crystal panel should light a large-area surface, the illumination device has a large size and requires several hundreds of LEDs.

The forward voltage drop of the respective LEDs is in the range of 1.5 V to 4.5 V. The forward voltage drop of the respective LEDs hardly varies with a variation in current and has a steady voltage characteristic. The light intensity emitted from the respective LEDs is controlled by adjusting the flowing current and current of 10 mA to 100 mA usually flows in the respective LEDs.

A illumination device having a configuration in which plural LEDs are connected in parallel and an illumination device having a configuration in which plural LEDs are connected in series have merits and defects. When the plural LEDs are connected in parallel, the voltage to be supplied from a power source corresponds to the forward voltage drop of one LED and is in the range of 1.5 V to 4.5 V, but the current to be supplied from the power source has a magnitude obtained by adding the current flowing in the LEDs. When the current to be supplied from the power source increases, power is consumed by wires from the power source to the LED, thereby increasing the resistance loss. For example, when 500 LEDs are connected in parallel and the current flowing in each LED is 20 mA, the current to be supplied from the power source is 10 A (500×20 mA) and thus the resistance loss increases.

When the plural LEDs are connected in series, the current to be supplied from the power source corresponds to the current flowing in one LED and is in the range of 10 mA to 100 mA, but the voltage to be supplied from the power source has a magnitude by adding the forward voltage drops of the LEDs. In this case, a high-voltage power source is necessary and thus the device is complicated. For example, when 500 LEDs are connected in parallel and the forward voltage drop of each LED is 4 V, the voltage to be supplied from the power source is 2 kV (500×4 V).

On the basis of the balance between the magnitude of the resistance loss and the complication of the power source, a general illumination device has a configuration in which plural LED arrays having LEDs connected in series are connected in parallel. In this case, when one LED is out of order and enters an open mode, that is, a disconnected state in which no current flows, the LED array including the out-of-order LED enters the open mode and thus all the LEDs in the LED array are extinguished.

FIG. 11 is a circuit diagram schematically illustrating a part of an illumination device 1 according to another related art. The illumination device 1 has a configuration in which two LEDs 2 and 3 are connected in parallel and LED units 4 each composed of two LEDs 2 and 3 connected in parallel are connected in series. When one LED 2 of the LED unit 4 is out of order and enters the open mode, but the other LED 3 is in a connected state, the LED unit 4 does not enter the open mode, thereby preventing all the LEDs 2 and 3 of the LED array from being extinguished.

When the mean time before failure of the LEDs is $10^6$ hours, the illumination device having several hundreds of LEDs has the possibility that the LEDs are out of order at the rate of one to several thousands of hours. In the conventional illumination device 1 shown in FIG. 11, when one LED 2 of the LED unit is out of order and enters the open mode, the current having flown in the out-of-order LED 2 flows in the other LED 3. Accordingly, the current flowing in the other LED 3 increases and thus the load of the other LED 3 increases. In the conventional illumination device 1, since the voltages applied to the LEDs 2 and 3 cannot be measured individually, it is difficult to detect the disorder of the LEDs 2 and 3 and it is difficult to establish the countermeasure to the disorder of the LEDs 2 and 3.

When plural LED arrays each having LEDs connected in series are connected in parallel and, as described above, one LED is out of order into a disconnected state, there is a problem in that all the LEDs of the LED array including the out-of-order LED are extinguished.

DISCLOSURE OF THE INVENTION

Accordingly, an object of the invention is to provide an illumination device that can prevent all light emitting elements from being extinguished even when some of plural light emitting elements connected in series are out of order.

Another object of the invention is to provide an illumination device that can make it easy to detect a disorder of a light emitting element, and to provide a liquid crystal display apparatus including the illumination device.

The invention provides an illumination device comprising:

a light emitting element array in which a plurality of light emitting elements that emit light with an application of a voltage are connected in series;

a plurality of current bypass elements that are individually connected in parallel to the light emitting elements of the light emitting element array and that are changed from a disconnected state where no current flows to a connected state where current flows when a predetermined voltage higher than that applied to the light emitting elements in an lighting state is applied thereto; and a power source unit that is connected to the light emitting element array in series and that applies a voltage to the light emitting elements.

Further, in the invention, it is preferable that the illumination device further comprises a plurality of terminal units for voltage detection connected to a connection path extending from a power source unit to a ground portion through the light emitting elements.

Further, in the invention, it is preferable that the illumination device further comprises a plurality of the light emitting element arrays, and each terminal unit includes:
a terminal body; and
a switching element having a control terminal, the switching element being connected between the connection path extending from the power source unit to the ground portion through the light emitting elements and the terminal body, and being completely switched between the disconnected state and the connected state in accordance with a control signal applied to the control terminal, and the terminal bodies of the terminal units connected to different light emitting element arrays being connected to each other.

Further, in the invention, it is preferable that the control terminals of the terminal units connected to one light emitting element array is connected to each other.

Further, in the invention, it is preferable that the switching element includes a MOS field effect transistor.

Further, in the invention, it is preferable that the switching element includes a bipolar transistor.

Further, in the invention, it is preferable that the power source unit includes a constant current source supplying constant current.

Further, the invention provides a liquid crystal display apparatus comprising:

the above-mentioned illumination device;
a liquid crystal display panel disposed opposite to one emission plane of the illumination device;
a voltage measuring unit measuring voltages of the terminal units; and
a control unit detecting lighting states of the light emitting elements based on the measurement result of the voltage measuring unit and adjusting the light transmittance of the liquid crystal display panel based on the lighting states of the light emitting elements.

BRIEF DESCRIPTION OF DRAWINGS

Other and further objects, features, and advantages of the invention will be more explicit from the following detailed description taken with reference to the drawings wherein:

FIG. 11 is a circuit diagram schematically illustrating a part of an illumination device 1 according to another related art.

BEST MODE FOR CARRYING OUT THE INVENTION

Figure 1:
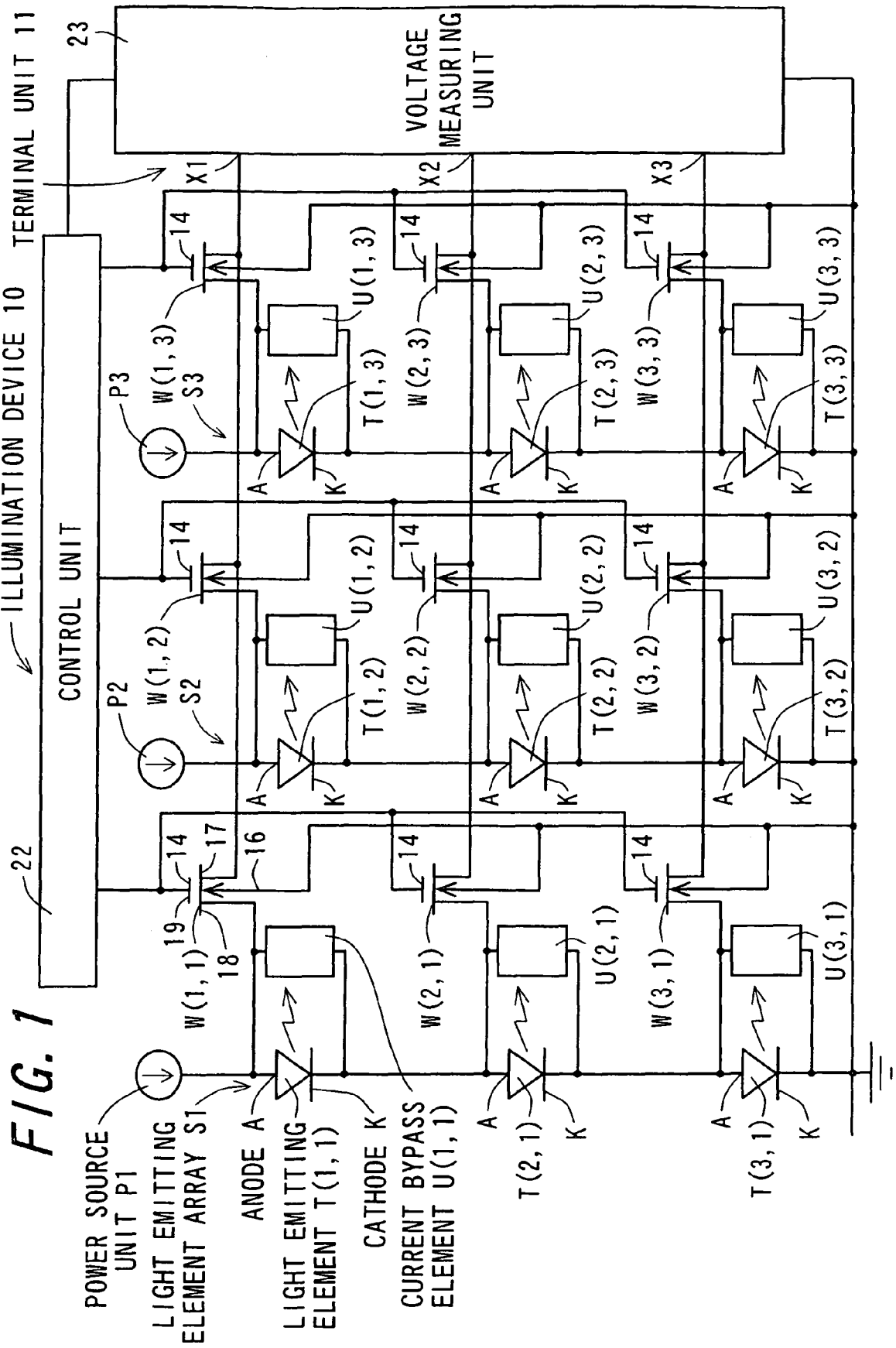
FIG. 1 is a circuit diagram illustrating a circuit configuration of an illumination device according to an embodiment of the invention.

Now referring to the drawings, preferred embodiments of the invention are described below.

FIG. 1 is a circuit diagram illustrating a circuit configuration of an illumination device 10 according to an embodiment of the invention. The illumination device 10 is used as a backlight of a liquid crystal display apparatus 21. The illumination device 10 includes plural light emitting element arrays S1, S2, ..., Si-1, and Si (where i is an integer of 2 or more), plural current bypass elements U, plural terminal units 11, and plural power source units P1, P2, ..., Pi-1, and Pi. A control unit 22 and a voltage measuring unit 23 included in the liquid crystal display apparatus 21 to be described later are shown in FIG. 1.

The general name of the light emitting element arrays S1, S2, ..., Si-1, and Si and an unspecified one of the light emitting element arrays S1, S2, ..., Si-1, and Si may be described as a light emitting element array S. The general name of the power source units P1, P2, Pi-1, and Pi and an unspecified one of the power source units P1, P2, ..., Pi-1, and Pi may be described as a power source unit P.

A light emitting element array Sm (where m is a positive integer) has a configuration in which light emitting elements T(1, m), T(2, m), ..., T(j−1, m), and T(j,m) (where j is an integer of 2 or more) are connected to each other in series. In the following description, the general name of the plural light emitting elements of the light emitting element array S and an unspecified one of the plural light emitting elements of the light emitting element array S may be described as a light emitting element T. FIG. 1 shows the illumination device 10 in which i=3 and j=3.

The light emitting element T emits light with an application of a voltage. In this embodiment, the light emitting element T is embodied by a light emitting diode (abbreviated as "LED"). The light emitting element T has, for example, a configuration in which an anode A, a p-type semiconductor layer, an n-type semiconductor layer, and a cathode K are stacked in this order. The anode A and the cathode K are made of a conductive material such as a metal material and an alloy material and specifically, is made of gold (Au), an alloy of gold and germanium (AuGe), an alloy of gold and zinc (AuZn), nickel (Ni), or aluminum (Al). The n-type semiconductor layer and the p-type semiconductor layer are formed by doping a semiconductor material such as gallium arsenide (GaAs), aluminum gallium arsenide (AlGaAs), gallium nitride (GaN), aluminum gallium indium nitride (AlGaInN), zinc selenide (ZnSe), and indium gallium phosphide (InGaP) with impurities. Particularly, when the illumination device 10 is used as a backlight of the liquid crystal display apparatus 21, white light should be emitted. Accordingly, colors are mixed based on three primary colors of red, green, and blue to form a white color. When the color rendering property is not made much of, a white diode obtained by mixing a yellow pigment into a blue LED may be used. On the contrary, when the color rendering property is made more of, LEDs of yellow and cyan may be added to three primary colors. The n-type semiconductor layer and the p-type semiconductor layer of the light emitting element T is formed by doping the semiconductor material such as GaN with impurities.

The light emitting elements T of the light emitting element array Sm are forward connected in series to each other. That is, the cathode K of the light emitting element T(n,m) (where n is an integer of 1 or more) and the anode A of the light emitting element T(n+1, m) are electrically connected. Since the forward voltage drop of the LED depends on an emission color (emission wavelength) of the LED (red: 1.5 V to blue-violet: 4.5 V), it is preferable that the light emitting element array Sm includes LEDs having the same emission color.

The forward voltage drop V1 which is a voltage between the anode A and the cathode K of the light emitting element T in a lighting state is about 1.5 V to 4.5 V. The forward voltage drop V1 hardly varies with a variation in current and has a constant voltage characteristic. When the light emitting element T is out of order, the light emitting element is changed from a connected state where current flows therein, that is, a short mode, to a disconnected state where current does not flow therein, that is, an open mode.

The current bypass elements U are connected in parallel to the light emitting elements T, respectively. A specified one of the current bypass elements U connected in parallel to the light emitting elements T(n,m), respectively, may be described as a current bypass element U(n,m). The current bypass element U is changed from the disconnected state where current does not flow therein to the connected state where current flows therein when a predetermined voltage is applied thereto. The predetermined voltage is selected to be higher than the voltage applied to the light emitting element T in a lighting state. Specifically, the predetermined voltage is selected to be higher than the forward voltage drop V1 of the light emitting element T in use of the illumination device 10.

The predetermined voltage when the current bypass element U is changed from the disconnected state to the connected state may be referred to as a dielectric breakdown voltage V2. By selecting the predetermined voltage to be higher than the forward voltage drop V1, the current bypass element U maintains the disconnected state when the light emitting elements T connected in parallel emit light normally. Accordingly, when the light emitting elements T connected in parallel are in a lighting state, current does not flow in the current bypass elements U and thus power is not be consumed by the current bypass elements U.

The current bypass element U is a two-terminal element in this embodiment and is embodied by an anti-fuse. The current bypass element U has a configuration in which a conductive layer, a polysilicon layer, an electric insulating layer, a polysilicon layer, and a conductive layer are stacked in this order. The conductive layer is formed of a conductive material such as metal and alloy, and specifically, is formed of gold (Au), an alloy of gold and germanium (AuGe), an alloy of gold and zinc (AuZn), nickel (Ni), or aluminum (Al). The polysilicon layer is formed of conductive polysilicon. The electric insulating layer has an electric insulating property and is formed of silicon oxide ($SiO_2$). The current bypass element U is formed to have a small size by a semiconductor process. By using such a small-sized current bypass element U, the size of the illumination device 10 can be reduced. In this embodiment, one conductive layer of the current bypass element U(n,m) is electrically connected to the anode A of the light emitting element T(n,m) and the other conductive layer of the current bypass element U(n,m) is electrically connected to the cathode K of the light emitting element T(n,m).

The power source units P are connected in series to the light emitting element arrays S, respectively, and apply a voltage to the light emitting elements T. Specifically, the power source unit Pm is connected in series to the light emitting element array Sm. A high-voltage terminal 15 of the power source unit Pm is connected to the anode A of the light emitting element T(1, m) of the light emitting element array Sm. In this embodiment, the power source units P serve as a constant current source and supply constant current to the light emitting element arrays S.

Figure 2:
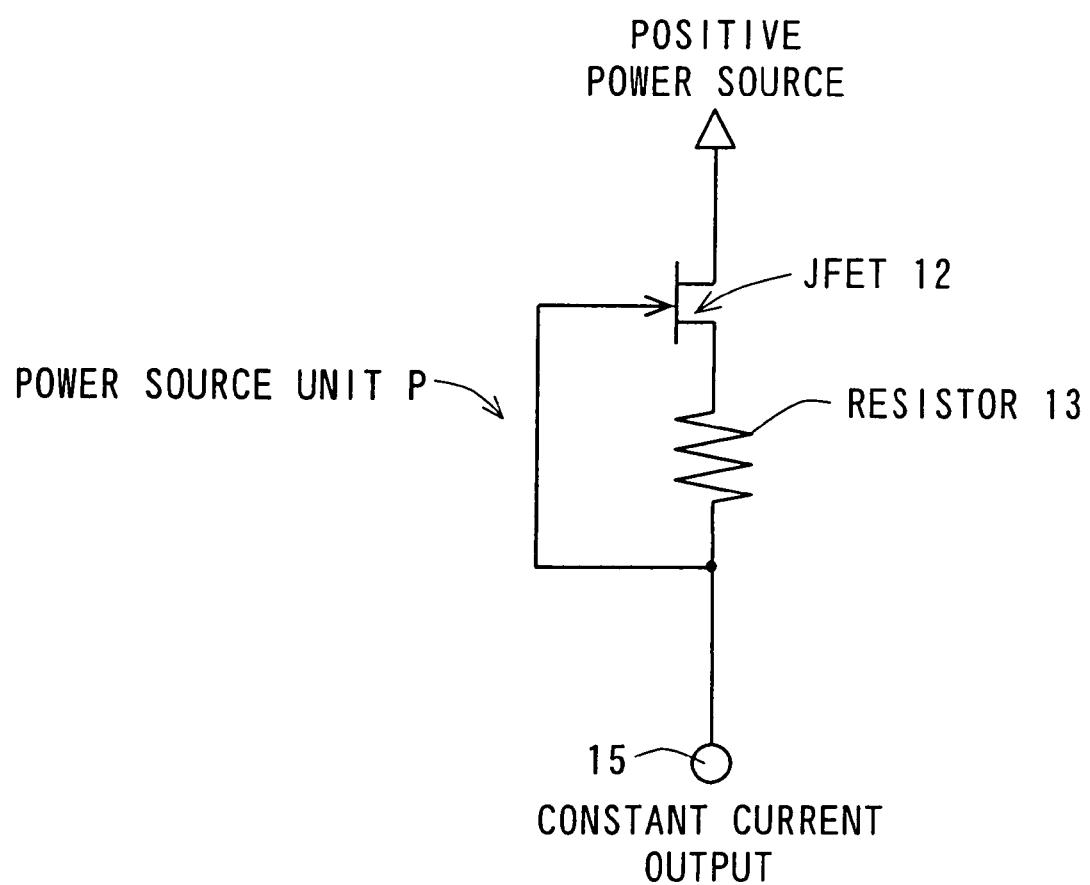
FIG. 2 is a circuit diagram illustrating a circuit configuration of a power source unit P.

FIG. 2 is a circuit diagram illustrating a circuit configuration of the power source unit P. The power source unit P includes a junction field effect transistor (abbreviated as JFET) 12 and a resistor 13. A drain of the JFET 12 is connected to a positive power source that is positive relative to a ground as a ground portion. The positive power source applies a constant voltage to the drain of the JEFT 12.

An end of the resistor 13 is connected to a source of the JFET 12 and the other end of the resistor 13 is connected to a gate of the JFET 12. That is, the source of the JFET 12 is connected to the gate through the resistor 13. The other end of the resistor 13 is also connected to the anode A of the light emitting element T(1, m).

The current flowing between the drain and the source of the JFET 12 is determined by the voltage across the gate and the source. Accordingly, when the resistance of the resistor 13 is made to be constant, the current flowing to the light emitting element array S through the other end of the resistor 13 is constant. That is, the power source unit P serves as a constant current source and can make constant current flow in the light emitting element array S even when the impedance of the light emitting element array S varies. Since the current flowing from the power source unit P to the light emitting element array S depends on the resistance of the resistor 13, it is possible to adjust the current flowing in the light emitting element array S, that is, the current flowing in the light emitting elements T, by adjusting the resistance. The power source unit P outputs constant current of 10 mA to 100 mA and supplies the output current to the light emitting element array S. Accordingly, the current of 10 mA to 100 mA flows in the light emitting elements T.

The terminal units 11 each include a terminal body X and a switching element W. The switching element W includes a control terminal 14 to which a control signal is applied. In this embodiment, the switching element W is embodied by an n-channel MOSFET (Metal Oxide Semiconductor FET). The control terminal 14 corresponds to the gate 19 of the MOSFET.

The drain 18 of the switching element W of each terminal unit 11 is connected to a connection path extending from the power source unit P to the ground as a ground portion through the light emitting elements T. In this embodiment, the connection path corresponds to a path electrically connecting the anode A of the light emitting element T(n,m) to the cathode K of the light emitting element T(n+1, m) and a path electrically connecting the anode A of the light emitting element T(1, m) to the high-voltage terminal 15 of the power source unit Pm. Specifically, the drains 18 of the switching elements W of the terminal units 11 are electrically connected to the anodes A of the light emitting elements T, respectively. In the following description, the switching elements W of the terminal units 11 individually connected to the anodes A of the light emitting elements T(n,m) may be specified and described as a switching element W(n,m).

The control terminals 14 of the terminal units 11 connected one light emitting element array S are connected to each other. That is, the control terminals 14 of the switching elements W(1, m), W(2, m), . . . , W(j−1, m), and W(j,m) are connected to each other and connected to the control unit 22. In this way, by connecting the control terminals 14 to each other, it is possible to reduce the number of terminals of the illumination device 10.

A substrate terminal 16 of the switching element W is connected to a portion having a potential smaller than the least potential of the source 17, the drain 18, and the gate 19. In this embodiment, the substrate terminal 16 of the switching element W is connected to the ground.

The terminal bodies X of the terminal units 11 connected to different light emitting element arrays S are connected to each other. In this embodiment, the sources 17 of the switching elements W(n,1), W(n, 2), . . . , W(n,i−1), and W(n,i) are connected to each other and connected to the common terminal body X. Accordingly, the terminal body W of the terminal unit 11 connected to the light emitting elements T(n,1), T(n, 2), . . . , T(n,i−1), and T(n,i) are shared. The terminal body X in which the sources 17 of the switching elements W(n,1), W(n, 2), . . . , W(n,i−1), and W(n,i) are connected to each other may be specified and described as a terminal body Xn. In this way, by sharing the terminal body X, it is possible to reduce the number of terminals of the illumination device 10.

The switching elements W are completely switched between the disconnected state and the connected state in accordance with the control signal applied to the control terminals 14. That is, each switching element W switches the anode A of the light emitting element T and the terminal body X having the same potential as the connection path to either the disconnected state or the connected state. In this embodiment, when a voltage higher than the voltage of the ground connected to the substrate terminal 16 is applied as the control signal to the control terminal 14, the source 17 and the drain 18 of the switching element W are electrically connected to each other and the anode A of the light emitting element T and the terminal body X are electrically connected to each other.

When the same voltage as the voltage of the ground connected to the substrate terminal 16 is applied as the control signal to the control terminal 14, the source 17 and the drain 18 of the switching element W are electrically disconnected from each other and the anode A of the light emitting element T and the terminal body X are electrically disconnected from each other. Since the MOSFET is used as the switching element W, it is possible to easily switch the anode A of the light emitting element T and the terminal body X to either the disconnected state or the connected state only by controlling the voltage.

A circuit operation will be described when a voltage higher than the ground voltage is applied as the control signal to the control terminals 14 of the switching elements W(1, m), W(2, m), . . . , W(j−1, m), and W(j,m) and the same voltage as the ground voltage is applied as the control signal to the control terminals 14 of the switching elements W other than the switching elements W(1, m), W(2, m), . . . , W(j−1, m), and W(j,m). In this case, the sources 17 and the drains 18 of the switching elements W(1, m), W(2, m), . . . , W(j−1, m), and W(j,m) are electrically connected to each other and the sources 17 and the drains 18 of the switching elements W other than the switching elements W(1, m), W(2, m), . . . , W(j−1, m), and W(j,m) are electrically disconnected to each other. Accordingly, the terminal body Xn and the anode A of the light emitting element T(n,m) are electrically connected to each other. That is, the terminal body Xn has the same potential as the anode A of the light emitting element T(n,m). For example, when a voltage higher than the ground voltage is applied as the control signal to the control terminals 14 of the light emitting elements T(1,2), T(2,2), and T(3,2) and the same voltage as the ground voltage is applied as the control signal to the control terminals 14 of the light emitting elements T other than the light emitting elements T(1,2), T(2,2), and T(3,2), the terminal bodies X1, X2, and X3 have the same potential as the anodes A of the light emitting elements T(1, 2), T(2,2), and T(3,2). In this way, by controlling the control signal applied to the control terminals 14 of the switching elements W, it is possible to make the voltage of the terminal body Xn equal to the voltage of the anode A of the light emitting element T(n,m) of the light emitting element array Sm.

A circuit operation will be described now when one of the light emitting elements T of the illumination device 10 is out of order and the operation modes is changed from the short mode to the open mode.

When all the light emitting elements T are normal and are in the short mode, the light emitting elements T are supplied with constant current from the power source unit P and the forward voltage drop V1 is applied between the anodes A and cathodes K of the light emitting elements T. At this time, the forward voltage drop V1 is applied to the current bypass elements U connected in parallel to the light emitting elements T. The current bypass elements U maintain the open mode as long as a voltage higher than the dielectric breakdown voltage V2 is not applied thereto. Accordingly, when the light emitting elements T connected in parallel are in a lighting state, the light emitting elements maintain the open mode. As a result, so long as the light emitting element T is not out of order into the short mode, no current flows in the current bypass elements U.

The light emitting elements T are connected in series. Accordingly, when the light emitting element T(n,m) of the light emitting element array Sm is out of order and is changed from the short mode to the open mode, the light emitting element array Sm is changed from the short mode to the open mode. At this time, a voltage V1×(j−1) obtained by adding the forward voltage drops V1 of the light emitting element T other than the light emitting element T(n,m) of the light emitting element array Sm is applied to the current bypass element U(n,m) connected in parallel to the light emitting element T(n,m) having been changed to the open mode. When this voltage is greater than the dielectric breakdown voltage V2, the current bypass element U(n,m) is changed from the open mode to the short mode. When the current bypass element U(n,m) is changed to the short mode, the current flowing in the light emitting element T(n,m) before the disorder flows through the current bypass element U(n,m) and thus the light emitting element array Sm is changed from the open mode to the short mode. Accordingly, the light emitting elements T other than the out-of-order light emitting element T(n,m) in the light emitting element array Sm is changed to the lighting state, thereby preventing the normal light emitting elements T from being extinguished.

The power source unit Pm supplies the constant current to the light emitting element array Sm. Accordingly, when the light emitting element T(n,m) is out of order, the impedance of the light emitting element array Sm varies, but the current flowing in the light emitting elements T does not vary. As a result, even when the light emitting element T(n,m) is out of order, the load applied to the light emitting elements T emitting light normally does not vary, thereby preventing an excessive load from being applied to the light emitting elements T. Accordingly, it is possible to elongate the lifetime of the illumination device 10.

The voltage measuring unit 23 measures the voltage of the terminal unit 11 relative to the ground. The voltage measuring unit 23 is embodied, for example, by an A/D converter. The voltage measuring unit 23 applies the measured voltage of the terminal unit 11 to the control unit 22 as digital data. In this embodiment, the voltage measuring unit 23 measures the voltage of the terminal body Xn when the voltage of the terminal body Xn is equal to the voltage of the anode A of the corresponding light emitting element T(n,m), and measures the voltage of the anode A of the light emitting element T(n,m).

The control unit 22 calculates the voltage across the anode A and the cathode K of the respective light emitting elements T on the basis of the voltage of the terminal unit 11 supplied from the voltage measuring unit 23. The voltage between the anode A and the cathode K of the light emitting element T(n,m) is equal to the voltage drop of the current bypass element U(n,m). Specifically, by subtracting the voltage of the terminal body Xn+1 from the voltage of the terminal body Xn, the voltage between the anode A and the cathode K of the light emitting element T(n,m) is calculated. Since the voltages of the terminal bodies X are based on the ground, the voltage between the anode A and the cathode K of the light emitting element T(j,m) is equal to the voltage of the terminal body Xj.

When a light emitting elements T is normal and emits light in the short mode, the voltage between the anode A and the cathode K of the light emitting element T is the forward voltage drop V1. The forward voltage drop V1 is about 1.5 V to 4.5 V as described above.

When the light emitting element T is out of order and is changed to the open mode, the current bypass element U connected in parallel to the light emitting element T is changed to the short mode and the voltage between the anode A and the cathode K of the light emitting element T in the open mode is equal to the voltage drop of the current bypass element U. When the current bypass element U is changed to the short mode, the resistance of the current bypass element U is close to zero and thus the voltage drop of the current bypass element U is close to zero. The resistance of the current bypass element U in the short mode is, for example, 50 mΩ or less. When the current of 10 mA to 100 mA flows in the light emitting element T, the current of 10 mA to 100 mA flows into the current bypass elements U. Accordingly, the voltage drop of the current bypass element U is 5 mV or less, which is satisfactorily smaller than the forward voltage drop V1. As a result, when the value obtained by subtracting the voltage of the terminal body Xn+1 from the voltage of the terminal body Xn is smaller than the forward voltage drop V1, it can be seen that the light emitting element T(n,m) of the light emitting element array Sm is in the open mode and is extinguished. When the voltage of the terminal body Xj is close to zero, it can be seen that the light emitting element T(j,m) is in the open mode and is extinguished. In this way, by processing the digital data indicating the voltages of the terminal bodies X applied from the voltage measuring unit 23, the control unit 22 can detect the lighting states of the light emitting elements T on the basis of the measurement result of the voltage measuring unit 23 and can specify the light emitting element T extinguished in the short mode.

Figure 3:
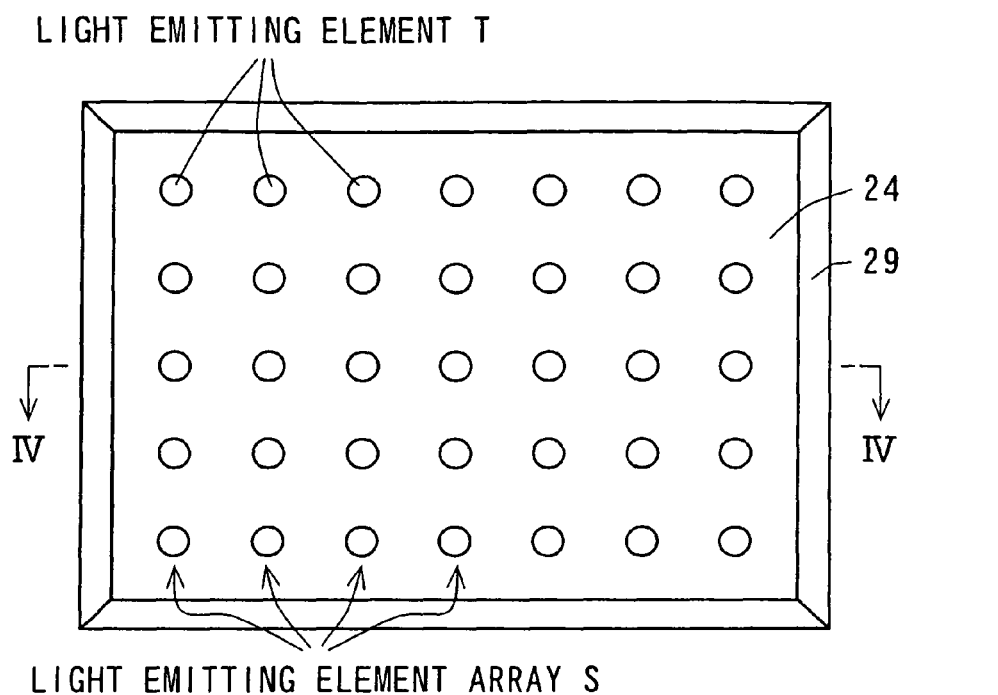
FIG. 3 is a plan view illustrating the illumination device.
Figure 4:
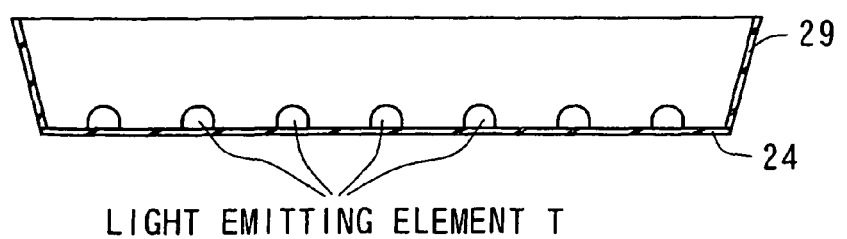
FIG. 4 is a sectional view of the illumination device taken along line IV-IV of FIG. 3.

FIG. 3 is a plan view illustrating the illumination device 10. FIG. 4 is a sectional view of the illumination device 10 taken along line IV-IV of FIG. 3. FIG. 3 shows the illumination device 10 when i=7 and j=5.

The light emitting element arrays S are linearly arranged on an insulating substrate 24 having a surface of a substantially planar shape at regular intervals. The illumination device 10 further includes a frame body 29 extending from the edge of the substrate 24 to a side from which the light emitting elements T emit light. The frame body 29 is formed that the sectional shape perpendicular to a thickness direction of the substrate 24 increases in size as it goes apart from the substrate 24. By the use of the frame body 29, it is possible to prevent the light from the light emitting elements T from leaking in the directions other than one thickness direction of the substrate 24. The light emitting elements T are linearly arranged on the substrate 24 in the direction perpendicular to a direction in which the light emitting element arrays S are arranged, at regular intervals. That is, the light emitting elements T are arranged in a matrix on the substrate 24. The light emitting elements T are disposed on the substrate 24 so that the emission direction of light is perpendicular to the surface of the substrate 24. The electrical connections of the circuit shown in FIG. 1 are embodied by bonding wires and lands formed on the substrate 24.

According to the liquid crystal display apparatus 21 described above, since the light emitting element T extinguished in the short mode can be specified, it is possible to simply and easily perform the inspection for distinguishing goodness and failure of the liquid crystal display apparatus 21, thereby easily specifying the light emitting element T to be replaced.

Figure 5:
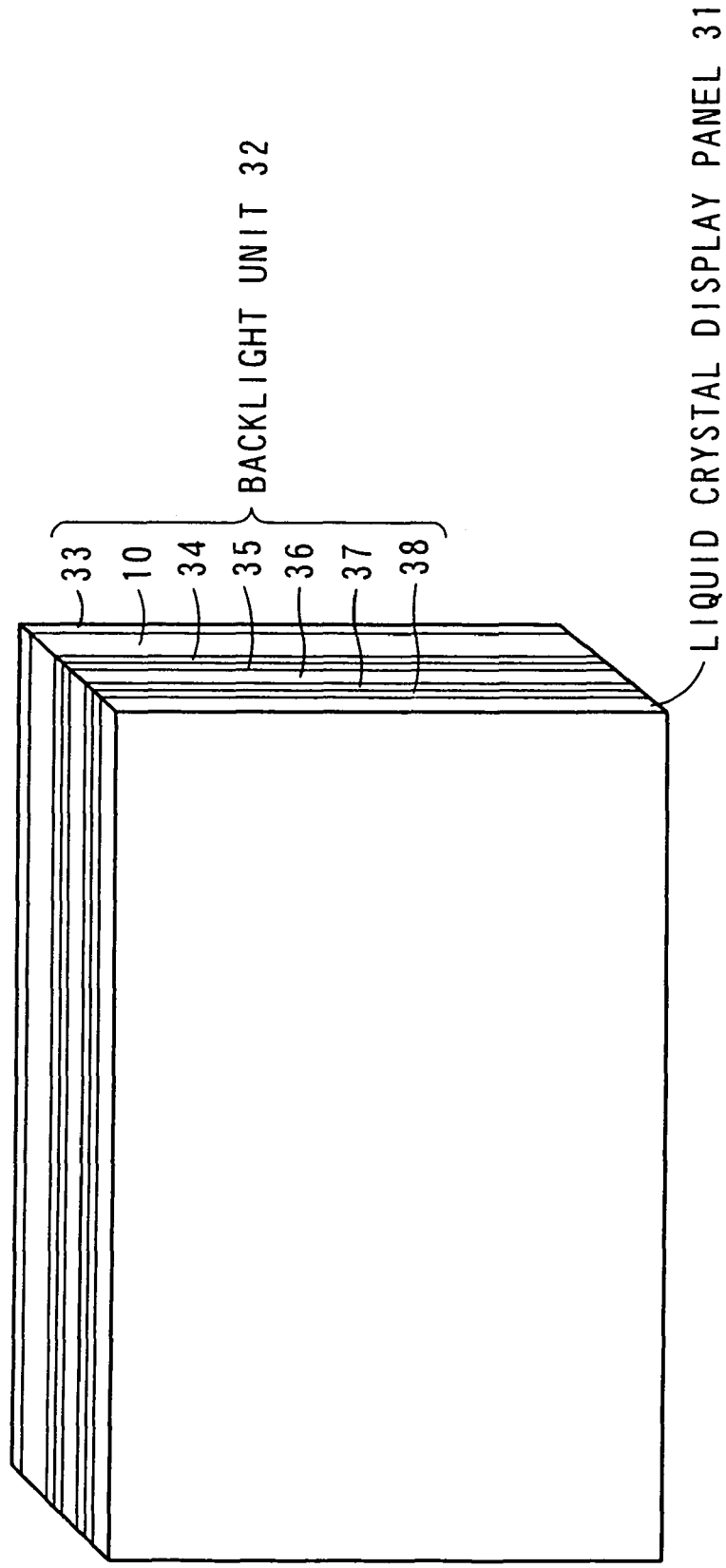
FIG. 5 is a perspective view schematically illustrating the liquid crystal display apparatus having the illumination device.

FIG. 5 is a perspective view schematically illustrating the liquid crystal display apparatus 21 having the illumination device 10. The liquid crystal display apparatus 21 includes a liquid crystal display panel 31, a backlight unit 32, a voltage measuring unit 23, a control unit 22, and a driving unit.

The backlight unit 32 includes a first rear shield 33, the illumination device 10 according to this embodiment disposed on one surface of the first rear shield 33 in a thickness direction thereof, a diffusing plate 34 disposed on one surface of the illumination device 10 in a thickness direction thereof, a diffusing sheet 35 disposed on one surface of the diffusing plate 34 in a thickness direction thereof, a prism sheet 36 disposed on one surface of the diffusing sheet 35 in a thickness direction thereof, a reflecting/polarizing sheet 37 disposed on one surface of the prism sheet 36 in a thickness direction thereof, and a spacer 38 disposed on the edge of one surface of the reflecting/polarizing sheet 37 in a thickness direction thereof. The liquid crystal display panel 31 is opposed to the reflecting/polarizing sheet 37 with the space 38 interposed therebetween and is opposed to one surface emitting the light of the illumination device 10.

The first rear shield 33 protects the liquid crystal display apparatus 22 from a mechanical impact and the like. The diffusing plate 34 and the diffusing sheet 35 are formed of semi-transparent plate and sheet diffusing the light passing therethrough. The light from the illumination device 10 is diffused by passing through the diffusing plate 34 and the diffusing sheet 35, and homogeneous light with small brightness deviation is obtained on a virtual plane perpendicular to the thickness direction of the illumination device 10. The light passing through the diffusing sheet 35 passes through the prism sheet 36, passes through the reflecting/polarizing sheet 37, and is collected on the liquid crystal display panel 31. The liquid crystal display apparatus 22 controls the amount of transmitted light by the use of the effect of rotating the polarization angle by the given electrical signal. The polarizing sheet serves to align polarization of light entering the liquid crystal display apparatus 22 and to control the amount of transmitted light by combination of the portion emitted from the liquid crystal display apparatus with the polarizing sheet. In the related art, a so-called polarizing sheet aligning directions of the polarized light by absorbing the light of the non-desired polarization direction was used. However, in order to enhance the utilization efficiency of light, a reflecting sheet may be used which aligns directions of polarized light by reflecting the light of the non-desired polarization direction.

The liquid crystal display panel 76 is controlled using an active matrix driving method and includes a liquid crystal layer, a pair of alignment films, a light-transmitting electrode which has a common potential, light-transmitting electrodes which include a plurality of TFTs (Thin Film Transistors) and to which voltages are individually applied, a pair of glass substrates, a color filter, and a pair of polarizing filters. The liquid crystal layer is filled between the pair of alignment films disposed opposite to each other with a spacer interposed therebetween. The light-transmitting electrodes are disposed opposite to each other with the pair of alignment films interposed therebetween. The color filter is disposed on one surface in the thickness direction apart from the illumination device 10 of the pair of alignment films. The pair of glass substrates are disposed opposite to each other with the color filter and the other alignment film interposed therebetween. The pair of polarizing filters are opposed opposite to each other with the pair of glass substrates interposed therebetween.

The control unit 22 is embodied by a device including a central processing unit (abbreviated as "CPU"), for example, a microcomputer. The control unit 22 includes a memory and gives a control signal to the control terminals 14 and controls the driving unit and the voltage measuring unit 23, by executing a control program stored in the memory.

The driving unit adjusts the transmittance of light emitted from the backlight unit 32 to visually display image information on the liquid crystal display panel 31, by adjusting the magnitude of voltage applied to the light-transmitting electrodes on the basis of a control command from the control unit 22.

The control unit 22 supplies the control signal to the control terminals 14 as described above and detects the lighting states of the light emitting elements T on the basis of the digital data indicating the voltages of the terminal bodies X from the voltage measuring unit 23. The control unit 22 controls the driving unit to adjust the transmittance of light of the liquid crystal display panel on the basis of the detected lighting states of the light emitting elements T. Specifically, the control unit adjusts the transmittance of light of the liquid crystal display panel 31 by controlling the voltages applied to the light-transmitting electrodes from the driving unit.

Figure 6:
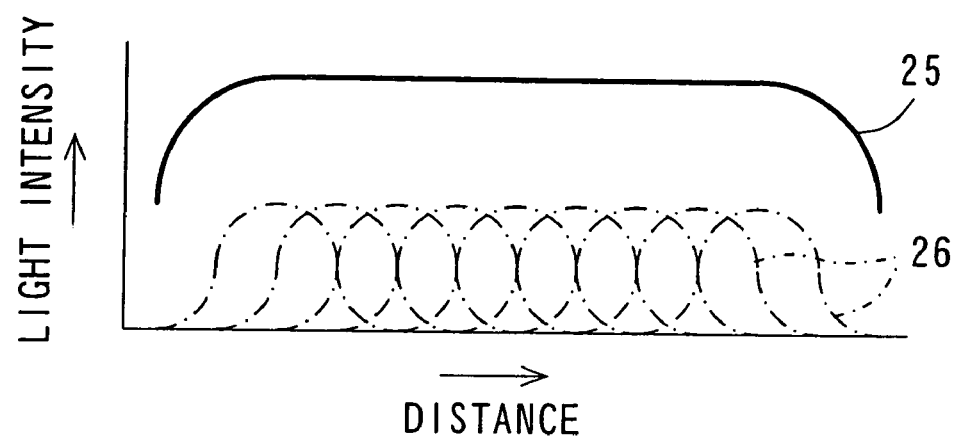
FIG. 6 is a diagram schematically illustrating the intensity of light from the illumination device and the light emitting elements T on the emission plane where all the light emitting elements T normally emit light.
Figure 7:
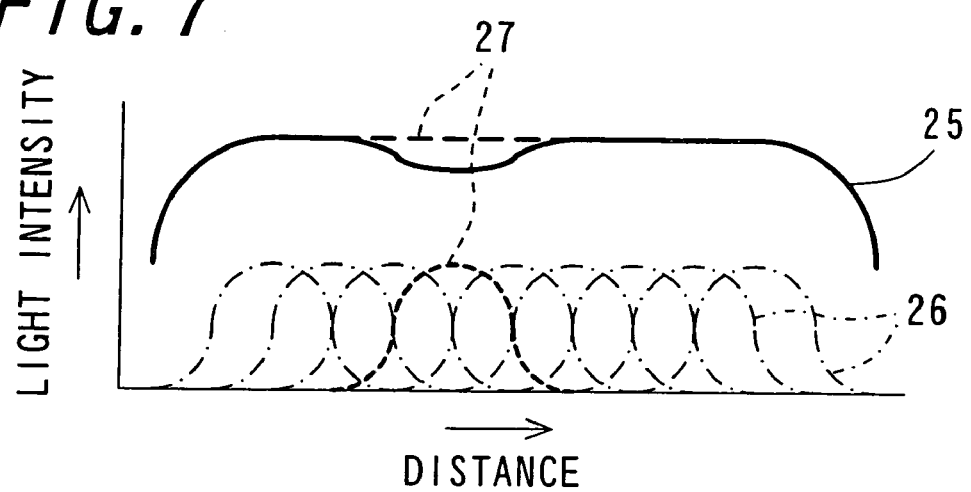
FIG. 7 is a diagram schematically illustrating the intensity of light from the illumination device and the light emitting elements T on the emission plane where one of the light emitting elements T is extinguished.
Figure 8:
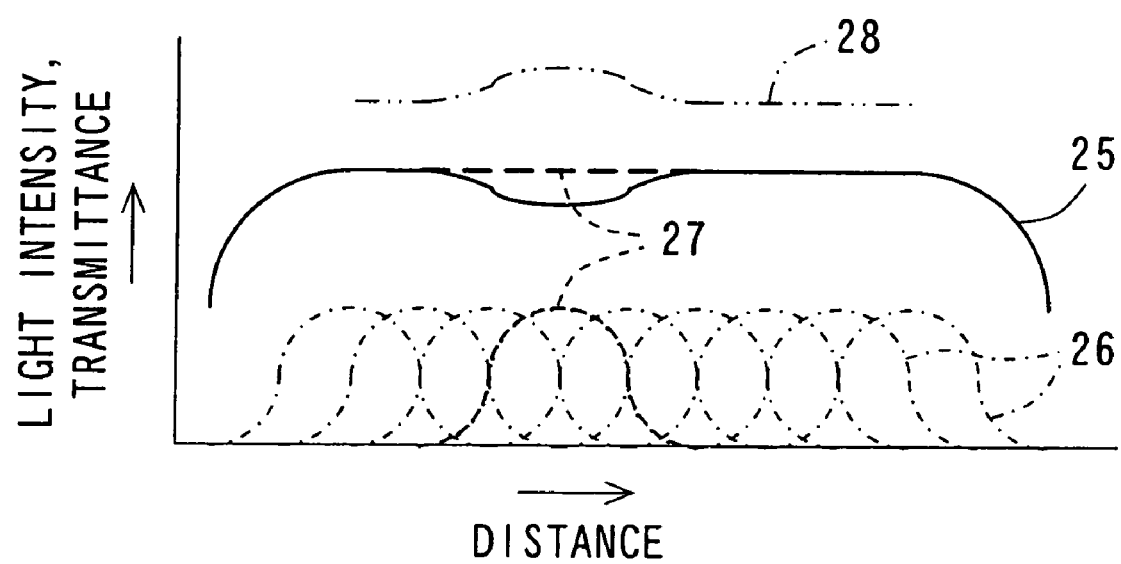
FIG. 8 is a diagram schematically illustrating the intensity of light from the illumination device and the light emitting elements T on the emission plane where one of the light emitting elements T is extinguished and the transmittance of the liquid crystal display panel.

FIG. 6 is a diagram schematically illustrating the intensity of light from the illumination device 10 and the light emitting elements T on the emission plane where all the light emitting elements T normally emit light. FIG. 7 is a diagram schematically illustrating the intensity of light from the illumination device 10 and the light emitting elements T on the emission plane where one of the light emitting elements T is extinguished. FIG. 8 is a diagram schematically illustrating the intensity of light from the illumination device 10 and the light emitting elements T on the emission plane where one of the light emitting elements T is extinguished and the transmittance of the liquid crystal display panel 31.

The emission plane is a virtual plane parallel to one surface in the thickness direction of the substrate 24 and is assumed to have a predetermined gap from the substrate 24. The vertical axis represents the light intensity. In FIG. 8, the vertical axis represents the light intensity and the transmittance. The horizontal axis represents a distance in the straight lines in which the light emitting elements T are arranged. The intensity of light from the illumination device 10 is indicated by a solid line 25 and the intensity of light from the light emitting elements T is indicated by a dot-chained line 26. The intensity of light from a light emitting element T and the intensity of light from the illumination device 10 are indicated by a dotted line 27, when it is assumed that the extinguished light emitting element T emits light. The transmittance of the liquid crystal display panel 31 is indicated by a two-dot chained line 28.

The light from the illumination device 10 is obtained by overlapping light beams from the light emitting elements T. The interval of the light emitting elements T is determined so that the intensity of light from the illumination device 10 becomes constant on the emission plane when the light emitting elements T emit light normally. Since the light from the illumination device 10 is obtained by overlapping the light beams from the light emitting elements T, when one of the light emitting elements T is extinguished, the light intensity on the emission plane is reduced by the intensity of light that had been emitted from that light emitting element T. Accordingly, the light intensity on the emission plane does not become constant and the emission area of the extinguished light emitting element T becomes dark, thereby causing reduction in light intensity.

When a specific light emitting element T is extinguished, the memory previously stores information indicating by what the light intensity of the emission area of the extinguished light emitting element T is reduced. The information can be calculated from the arrangement of the light emitting elements T. The control unit 22 adjusts the transmittance of light of the liquid crystal display panel 31 on the basis of the lighting states of the light emitting elements T. Specifically, the control unit 22 estimates reduction in light intensity on the basis of the information stored in the memory when a specific light emitting element T is extinguished. The control unit 22 determines the amount of transmittance to be adjusted of a portion of the liquid crystal display panel 31 so as to correct the reduction based on the estimated reduction in light intensity, and controls the driving unit to adjust the transmittance of the liquid crystal display panel 31.

The light transmittance of the liquid crystal display panel 31 is adjusted on the basis of the image information and the lighting states of the light emitting elements T. For example, when the image information is expressed in k bits (where k is a positive integer), the transmittance information for adjusting the transmittance is (k+s)-bit information obtained by adding s bits (where is a positive integer) for adjustment to the lower bit of the image information. The light transmittance of the liquid crystal display panel 31 is adjusted on the basis of the transmittance information. The transmittance is adjusted to increase as the transmittance information increases, and the transmittance is adjusted to decrease as the transmittance information decreases. Specifically, the voltage applied to the light-transmitting electrodes is made to increase as the transmittance information increases, and the voltage applied to the light-transmitting electrodes is made to decrease as the transmittance information decreases.

The lower s bits of the information for adjusting the transmittance are set to "0" when all the light emitting elements T emit light. The lower s bits of the information on the emission area of the extinguished light emitting element T are set depending to the extent by which the transmittance should be adjusted. Specifically, as the extent by which the transmittance should be adjusted increases, the values of the lower s bits are set to increase. For example, all the lower s bits of the information on the area of which the transmittance should be most adjusted are set to "1". Accordingly, since the information for adjusting the transmittance increases by ($2^s-1$), the transmittance increases as mush and the emission area of the extinguished light emitting element T increases in gray scale by ($2^s-1$). In this way, by adjusting the transmittance, it is possible to prevent the emission area of the extinguished light emitting element T from becoming dark in the liquid crystal display panel 31.

In an illumination device according to another embodiment of the invention, the switching elements W of the illumination device 10 are embodied by p-channel MOSFETs. In this case, the connection relation of the anodes A and the cathodes K of the light emitting elements T in the above-mentioned embodiment is inverted and the ground and the high-voltage terminals 15 of the power source units P in the above-mentioned embodiment are exchanged with each other. That is, the cathode K of the light emitting element T(1, m) is connected to the ground and the anode A of the light emitting element T(j,m) and the substrate terminal 16 are connected to the high-voltage terminal 15 of the power source unit Pm. In order to electrically connect the source 17 and the drain 18 of the MOSFET to each other, a voltage lower than the voltage of the substrate terminal 16 is applied to the gate 19 serving as the control terminal 14.

In an illumination device according to still another embodiment of the invention, a switching element W connected to the cathode K of the light emitting element T(j,m) is additionally provided in the illumination device 10. In this case, the control unit 22 can calculate a voltage applied between the anode A and the cathode K of the light emitting element T(j,m) from the difference in voltage between the sources 17 of two switching elements W connected to the light emitting element T(j,m), without using the ground potential as a reference.

In an illumination device according to still another embodiment of the invention, the current bypass elements U of the illumination device 10 may be embodied by a tantalum-sintered electrolytic capacitor. The tantalum-sintered electrolytic capacitor is changed from the open mode to the short mode when a predetermined voltage is applied thereto. When the voltage of the tantalum-sintered electrolytic capacitor changed to the short mode is greater than the forward voltage drop V1 of the light emitting element T and the light emitting elements T connected in parallel are changed to the open mode as described above, the current bypass elements U are changed from the open mode to the short mode. Accordingly, it is possible to implement an illumination device in which only the light emitting element T out of order and changed to the open mode is extinguished.

Figure 9:
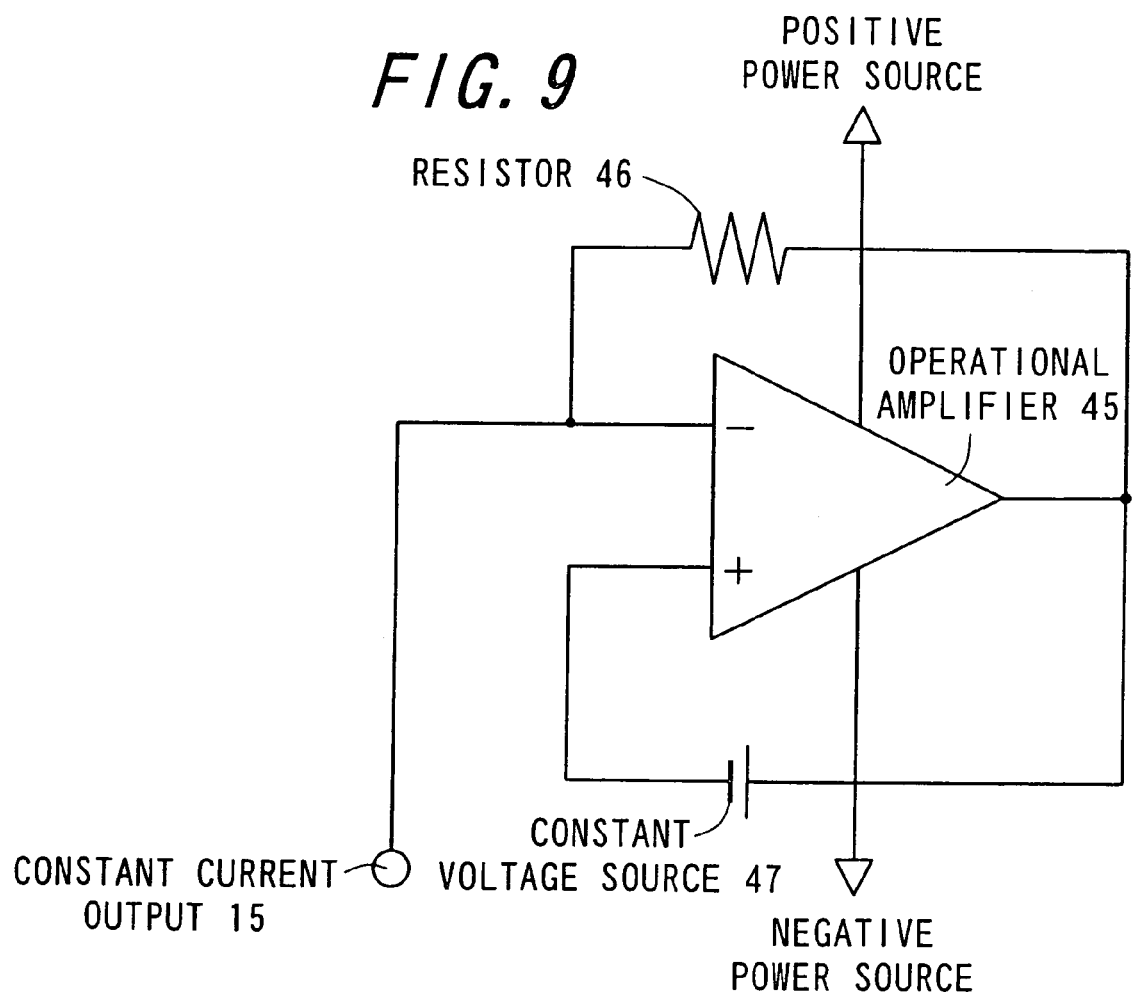
FIG. 9 is a circuit diagram illustrating a circuit configuration of the power source unit P of an illumination device according to still another embodiment of the invention.

FIG. 9 is a circuit diagram illustrating a circuit configuration of the power source unit P of an illumination device according to still another embodiment of the invention. The illumination device according to this embodiment is different in configuration from the power source units P of the above-mentioned embodiments. The power source unit P includes an operational amplifier 45, a resistor 46, and a constant voltage source 47. The constant voltage source 47 is embodied, for example, by a three-terminal regulator.

The positive power terminal of the operational amplifier 45 is connected to a positive power source having a voltage higher than the ground voltage. The negative power terminal of the operational amplifier 45 is connected to a negative power source having a voltage lower than the ground voltage. One end of the resistor 46 is connected to the output terminal of the operational amplifier 45. The other end of the resistor 46 is connected to the constant-voltage terminal of the constant voltage source and the inverted input terminal of the operational amplifier 45. The high-voltage terminal 15 of the constant voltage source 47 is connected to the non-inverted input terminal of the operational amplifier 45. The other end of the resistor 46 is connected to the anode A of the light emitting element T(1, m). The operational amplifier 45 operates so that the voltage drop due to the current flowing in the resistor 46 corresponds to the voltage of the constant voltage source 47. At this time, when the input impedance of the operational amplifier 45 is satisfactorily higher than the parallel sum of impedances of the resistor 46 and the constant current output 15 connected as a load, the current flowing in the inverted input terminal of the operational amplifier 45 can be neglected and thus the current flowing in the resistor 46 becomes the current flowing the resistor array. When the voltage of the constant voltage source 47 is $V_{47}$ and the resistance of the resistor 46 is $R_{46}$, the current $I_{15}$ of the constant current output 15 is expressed by the following expression (1).

$$V_{47} = R_{46} \times I_{15} \quad (1)$$

The current value of the constant current output 15 can be set using the resistor having the resistance value obtained from the following expression (2).

$$R_{46} = V_{47}/I_{15} \quad (2)$$

In an illumination device according to still another embodiment of the invention, the power source unit P may be embodied by a current mirror circuit. The power source unit P may be embodied by chopper control.

Figure 10:
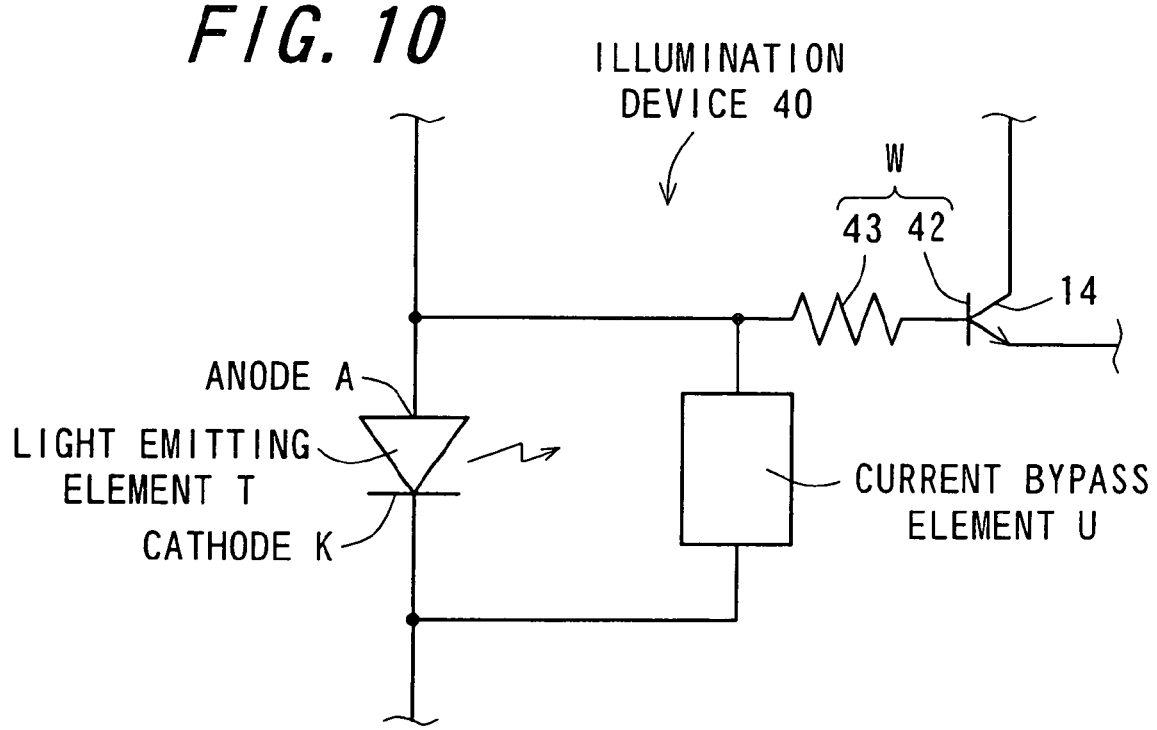
FIG. 10 is a circuit diagram illustrating a partial circuit configuration of an illumination device according to still another embodiment of the invention.

FIG. 10 is a circuit diagram illustrating a partial circuit configuration of an illumination device 40 according to still another embodiment of the invention. Since the illumination device 40 according to this embodiment has the same configuration as the illumination devices of the above-mentioned embodiments, the corresponding elements are denoted by the same reference numerals and signs and the repeated description thereof is omitted. The illumination device 40 according to this embodiment is different from the illumination devices according to the above-mentioned embodiments in the switching elements W of the terminal units 11.

Each switching element W includes a bipolar transistor 42 and a resistor 43 in this embodiment. The bipolar transistor 42 may be described as a transistor 42 in the following description. One end of the resistor 43 is connected to the base of the transistor 42. The other end of the resistor 43 of each switching element W is connected to the anode A of the corresponding light emitting element T.

The control terminal 14 corresponds to the collector of the transistor 42. The control terminals 14 of the switching elements W(1, m), W(2, m), . . . , W(j−1, m), and W(j,m) are connected to each other and are connected to the control unit 22. The emitters of the switching elements W(n,1), W(n,2), . . . , W(n,i−1), and W(n,i) are connected to each other and connected to the terminal bodies Xn.

When measuring the voltage of the anodes A of the light emitting elements T of the light emitting element array Sm, the control unit 22 applies a voltage higher than the forward voltage drop V1×j as a control signal to the control terminals 14 of the switching elements W(1, m), W(2, m), . . . , W(j−1, m), and W(j,m) to set a high resistance between the control terminals 14 of the switching elements W other than the switching elements W(1, m), W(2, m), W(j−1, m), and W(j,m) and the control unit 22. Accordingly, the collectors of the switching elements W other than the switching elements W(1, m), W(2, m), . . . , W(j−1, m), and W(j,m) are opened.

When a voltage higher than the voltage of the anodes A of the light emitting elements T is applied as a control signal to the control terminals 14, the collectors and the emitters are electrically connected to each other and the voltage of the emitters becomes a value obtained by subtracting the forward voltage drop between the base and the emitter and the voltage drop of the resistor 43 from the voltage of the anodes A of the light emitting elements T. In the state where the collectors are electrically connected to the emitters, the forward voltage drop between the base and the emitter is almost constant and is in a range of 0.6 V to 0.7 V. In the state where the collectors are electrically connected to the emitters, the current hardly flows in the bases and thus the voltage drop of the resistor 43 is negligibly smaller than the forward voltage drop between the base and the emitter. Accordingly, when a voltage higher than the voltage of the anodes A of the light emitting elements T is applied as the control signal to the control terminals 14, a voltage indicating the voltage of the anodes A of the light emitting elements T is output from the emitters. Since a bipolar transistor is used as the switching element W, it is possible to easily switch the anodes A of the light emitting elements T having the same potential as the connection path and the terminal bodies X to one of the disconnected state and the connected state, only by controlling the voltage.

The voltage of the anode A of the light emitting element T(n,m) is the forward voltage drop V1×(j−n−1) when the light emitting elements T(n,m), (n+1, m), . . . , T(j−1, m), and T(j,m) emit light normally in the short mode. When several, for example, four, light emitting elements of the light emitting elements T(n,m), (n+1, m), . . . , T(j−1, m), and T(j,m) are extinguished into the open mode, the voltage of the anode A of the light emitting element T(n,m) is equal to the forward voltage drop V1×(j−n−1-4). In this way, when there is an extinguished light emitting element T, the voltages of the anodes A of the light emitting elements T(n,1), T(n,2), . . . , T(n,i−1), and T(n,i) may be different from each other.

A method of measuring the voltage of the anode A of the light emitting element T(n,m) will be described now. It is assumed that the resistor 43 is omitted and the gate 19 of the switching element W is connected to the anode A of the light emitting element T not via the resistor 43. In this case, when the collect is open but the forward voltage is applied to the base and the emitter, the base and the emitter are electrically connected to each other and the voltage of the emitter becomes a value obtained by subtracting the forward voltage drop from the base voltage. Accordingly, even when the resistor 43 is omitted and the voltage is applied to only the control terminal 14 of the switching element W(n,m), the voltage of the terminal body Xn becomes a value obtained by subtracting the forward voltage drop V1 from the highest voltage of the anodes A of the light emitting elements T(n,1), T(n,2), . . . , T(n,i−1), and T(n,j). When the resistor 43 is omitted and the high voltage is applied to the control terminal 14 of the switching element W(n,m), the voltage indicating the voltage of the anode A of the light emitting element T(n,m) may not be output to the terminal body Xn. Accordingly, the voltage of the anode A of the light emitting element T(n,m) cannot be accurately measured.

When the base of the switching element W is connected to the anode A of the light emitting element T via the resistor 43 and the base and the emitter are electrically connected to each other to allow current to flow therebetween with the collector opened, the voltage drop due to the resistor 43 increase and thus the voltage indicating the voltage of the anode A of the light emitting element T is not output to the emitter. That is, the voltage drop of the resistor 43 absorbs the voltage difference between the voltage of the anode A of the light emitting element T(n,m) and the voltage of the anode A of another light emitting element T to be measured. By connecting the resistor 43 to the base, when a high voltage is applied to the control terminal 14 of the switching element W(n,m), the terminal body Xn has a voltage indicating the voltage of the anode A of the light emitting element T(n,m). Accordingly, whether there is a light emitting element T out of order into the open mode, it is possible to specify the out-of-order light emitting element T by measuring the voltage of the anode A of a predetermined light emitting element T. Even when a forward voltage is applied between the collector and the other end of the resistor 43, the voltage can be absorbed by the voltage drop of the resistor 43, thereby preventing current from flowing from the base to the collector.

In an illumination device according to still another embodiment of the invention, the connection between the emitter and the collector of a transistor of a switching element W may be opposite to the connection between the emitter and the collector of the transistor 42 of the illumination device according to the above-mentioned embodiments. Specifically, the emitter may be connected to the control unit 22 to allow the emitter to serve as the control terminal 14 and the collector may be connected to the terminal body X.

The illumination devices according to the above-mentioned embodiments may be used for traffic lights and lighting devices in photographing studios and show windows requiring a high color rendering property, in addition to the backlight of the liquid crystal display panel.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, since the current bypass elements are connected in parallel to the light emitting elements, the same voltage as applied to the light emitting elements is applied thereto. The current bypass elements maintain the disconnected state in the state where the voltage applied to the light emitting elements is applied thereto in the lighting state.

Accordingly, when the light emitting elements emit light, the current bypass elements maintain the disconnected state and do not transmit the current. As a result, when the light emitting element emits light normally, the current bypass elements do not consume the power.

The light emitting elements are connected in series to each other. Accordingly, when one of the light emitting elements is out of order and is changed from the connected state to the disconnected state, the light emitting element array is changed to the disconnected state. At this time, the voltage applied from the power source unit to the light emitting element array is temporarily applied to the current bypass element connected in parallel to the light emitting element changed to the disconnected state. When the voltage exceeds a predetermined voltage, the current bypass element is changed from the disconnected state to the connected state. Accordingly, the current flowing in the light emitting element changed to the disconnected state flows in the current bypass element and thus the light emitting element array is changed to the connected state. In this way, by connecting the current bypass elements in parallel to the light emitting elements, even when one of the light emitting elements of the light emitting element array is changed to the disconnected state, it is possible to prevent all the light emitting elements of the light emitting element array from being extinguished.

According to the invention, since the plural terminal units are connected to the connection path extending from the power source unit to the ground through the light emitting elements, that is, the connection path between the light emitting elements or the connection path between the power source unit and the light emitting elements, the voltages applied to the light emitting elements are calculated by measuring the voltages of the terminal units.

As described above, since the current bypass elements connected in parallel to the light emitting elements out of order into the disconnected state is in the connected state, the voltage applied to the out-of-order light emitting element, that is, the voltage drop of the current bypass element in the connected state, is smaller than the voltage applied to the light emitting element in the lighting state. Since the voltages applied to the light emitting elements can be calculated, the light emitting element changed to the disconnected state, that is, the out-of-order light emitting element, can be easily specified from the voltage.

According to the invention, since the switching elements are completely switched between the disconnected state and the connected state depending on the control signals supplied to the control terminals, the connection of the terminal body to the connection path between the light emitting elements or the connection path between the power source unit and the light emitting elements is completely switched depending on the control signals. Since the terminal bodies of the terminal units connected to different light emitting element arrays are connected to each other into the same potential but the connections to the connection path is switched depending on the control signals, the voltage of a specific connection path corresponding to the control signal, that is, the voltage of the terminal of a specific light emitting element is output. Accordingly, the voltages applied to the light emitting elements are calculated from the voltages of the plural terminal units. By connecting the terminal bodies of the terminal units connected to the different light emitting element array to each other, the terminal bodies can be shared, thereby reducing the number of terminal bodies. Accordingly, it is possible to reduce the number of terminals of the illumination device.

According to the invention, since the control terminals of the terminal units connected to one light emitting element array are connected to each other, the control terminals can be shared, thereby reducing the number of terminals connected to the control terminals.

According to the invention, the switching element includes a MOSFET. Since the MOSFET can be switched between the connected state and the disconnected state only by controlling the applied voltage, the connection path extending from the power source unit to the ground via the light emitting elements and the terminal bodies can be easily switched to one of the disconnected state and the connected state.

According to the invention, the switching element includes a bipolar transistor. Since the bipolar transistor can be switched between the connected state and the disconnected state only by controlling the applied voltage, the connection path extending from the power source unit to the ground via the light emitting elements and the terminal bodies can be easily switched to one of the disconnected state and the connected state.

According to the invention, since the power source unit includes a constant current source supplying constant current and supplies the constant current to the light emitting element arrays, the current flowing in the light emitting elements does not vary. Accordingly, even when some light emitting elements are out of order, the load applied to the light emitting elements emitting light normally does not vary, thereby preventing an excessive load from being applied to the light emitting elements. As a result, it is possible to elongate the lifetime of the illumination device.

According to the invention, since the liquid crystal display panel is disposed opposite to one surface emitting the light of the illumination device, the illumination device serves as a backlight applying light to the liquid crystal display panel. The voltage measuring unit measures the voltages of the terminal units. The control unit determines whether the light emitting elements are in the connected state or the disconnected state on the basis of the voltages of the terminal units measured by the voltage measuring unit, and detects the lighting states of the light emitting elements. For example, when a light emitting element in the disconnected state emits light, the control unit adjusts to enhance the transmittance of light of the liquid crystal display panel in the emission area of the light emitting element. Accordingly, when a light emitting element is changed to the disconnected state and is extinguished, it is possible to prevent the deterioration in brightness of the emission area of the extinguished light emitting element in the liquid crystal display panel.

The invention claimed is:

1. An illumination device comprising:
    a plurality of light emitting element arrays, each light emitting element array in which a plurality of light emitting elements that emit light with an application of a voltage are connected in series;
    a plurality of current bypass elements that are individually connected in parallel to the light emitting elements of the light emitting element array and that are changed from a disconnected state where no current flows to a connected state where current flows when a predetermined voltage higher than that applied to the light emitting elements in an lighting state is applied thereto;
    a power source unit that is connected to the light emitting element array in series and that applies a voltage to the light emitting elements; and
    a plurality of terminal units for voltage detection connected to a connection path extending from a power source unit to a ground portion through the light emitting elements, wherein each terminal unit includes: a terminal body; and a switching element having a control terminal, the switching element being connected between the connection path extending from the power source unit to the ground portion through the light emitting elements and the terminal body, and being completely switched between the disconnected state and the connected state in accordance with a control signal applied to the control terminal, wherein the terminal bodies of the terminal units connected to different light emitting element arrays are connected to each other.

2. The illumination device of claim 1, wherein the control terminals of the terminal units connected to one light emitting element array is connected to each other.

3. The illumination device of claim 1, wherein the switching element includes a MOS field effect transistor.

4. The illumination device of claim 1, wherein the switching element includes a bipolar transistor.

5. The illumination device of claim 1, wherein the power source unit includes a constant current source supplying constant current.

6. A liquid crystal display apparatus comprising:
a) an illumination device including:
  i) a light emitting element array in which a plurality of light emitting elements that emit light with an application of a voltage are connected in series;
  ii) a plurality of current bypass elements that are individually connected in parallel to the light emitting elements of the light emitting element array and that are changed from a disconnected state where no current flows to a connected state where current flows when a predetermined voltage higher than that applied to the light emitting elements in a lighting state is applied thereto;
  iii) a power source unit that is connected to the light emitting element array in series and that applies a voltage to the light emitting elements; and
  iv) a plurality of terminal units for voltage detection connected to a connection path extending from a power source unit to a ground portion through the light emitting elements;
b) a liquid crystal display panel disposed opposite to one emission plane of the illumination device;
c) a voltage measuring unit measuring voltages of the terminal units; and
d) a control unit detecting lighting states of the light emitting elements based on the measurement result of the voltage measuring unit and adjusting the light transmittance of the liquid crystal display panel based on the lighting states of the light emitting elements.

* * * * *